(12) United States Patent
Brcka et al.

(10) Patent No.: US 7,763,551 B2
(45) Date of Patent: Jul. 27, 2010

(54) RLSA CVD DEPOSITION CONTROL USING HALOGEN GAS FOR HYDROGEN SCAVENGING

(75) Inventors: Jozef Brcka, Loundonville, NY (US); Song Yun Kang, Kobe (JP); Toshio Nakanishi, Hyogo (JP); Peter L. G. Ventzek, Austin, TX (US); Minoru Honda, Osaka (JP); Masayuki Kohno, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 229 days.

(21) Appl. No.: 12/059,100

(22) Filed: Mar. 31, 2008

(65) Prior Publication Data
US 2009/0241310 A1 Oct. 1, 2009

(51) Int. Cl.
*H01L 21/31* (2006.01)
(52) U.S. Cl. .................. 438/792; 438/791; 257/E21.24
(58) Field of Classification Search ................ 438/791, 438/792; 427/578, 579
See application file for complete search history.

(56) References Cited

U.S. PATENT DOCUMENTS

| 6,399,520 B1 * | 6/2002 | Kawakami et al. .......... 438/778 |
| 2005/0145177 A1 * | 7/2005 | McSwiney et al. ... 118/723 MA |
| 2007/0254113 A1 * | 11/2007 | Hongo et al. ............... 427/579 |

OTHER PUBLICATIONS

Boehme et al., Dissociation reactions of hydrogen in remote plasma-enhanced chemical-vapor-deposition silica nitride, J. Vac. Sci. Technol. A 19(5) 2001, 2622-2628.

Smith et al., Mechanism of SiNxHy Deposition from NH-SiH4 Plasma, J. Electrochem. Soc., vol. 137, No. 2, Feb. 1990.

Hanyaloglu et al., Low temperature plasma deposition of silicon nitride from silane and nitrogen plasmas, J. Vac. Sci. Technol. A 16(5), Sep./Oct. 1998, 2794-2803.

Veprek et al., The mechanism of plasma-induced deposition of amorphous silicon from silane, Plasma Chemistry and Plasma Processing, vol. 10, No. 1, 1990, 3-26.

Tian et al., Characteristics of large-diameter plasma using a radial-line slot antenna, J. Vac. Sci. Technol. A 24(4), Jul./Aug. 2006, 1421-1424.

Smith et al., Mechanism of SiNxHy deposition from N2-SiH4 plasma, J. Vac. Sci. Technol. B 8(3), May/Jun. 1990, 551-557.

(Continued)

*Primary Examiner*—Alexander G Ghyka
(74) *Attorney, Agent, or Firm*—Wood, Herron & Evans, L.L.P.

(57) ABSTRACT

Film thickness uniformity and stoichiometry are controlled and deposition rate is increased in the chemical vapor deposition (CVD) of silicon nitride from complex gas mixtures in microwave plasmas. In $Si_2H_6+NH_3+Ar$ gas mixtures using a radial line slot antenna (RLSA) microwave plasma to deposit SiN by CVD, deposition rate and film uniformity are improved by limiting the amounts of atomic or molecular hydrogen from the gas mixture during the deposition process. A halogen, for example, fluorine, is added to a gas mixture of silane or disilane, ammonia and argon. The halogen scavenges hydrogen from the mixture, and prevents the hydrogen from blocking the nitrogen and silicon atoms and their fragments from bonding to the surface atoms and to grow stoichiometric silicon nitride. Adding the halogen generates free halogen radicals that react with hydrogen to create hydrogen halide, for example, HF or HCl, thereby scavenging the hydrogen.

14 Claims, 7 Drawing Sheets

OTHER PUBLICATIONS

Meikle et al., Thin-film deposition in the afterglows of N2 and H2 microwave plasmas, J. Vac. Sci. Technol. A 9 (3), May/Jun. 1991, 1051-1054.

Kessels et al., Plasma diagnostic study of silicon nitride film growth in a remote Ar—H2—N2—SiH4 plasma: Role of N and SiHn radicals, J. Vac. Sci. Technol. A 22(1), Jan./Feb. 2004, 96-106.

Landheer et al., Growth and characterization of silicon nitride films produced by remote microwave plasma chemical vapor deposition, J. Vac. Sci. Technol. A 9(5), Sep./Oct. 1991, 2594-2601.

Kaganowitz et al., Relation between flow, power, and presence of carrier gas during plasma deposition of thin films, J. Vac. Sci. Technol. A4(4) 1986, 1901-1904.

\* cited by examiner

RLSA CVD DEPOSITION CONTROL USING HALOGEN GAS FOR HYDROGEN SCAVENGING

This invention relates to the chemical vapor deposition of silicon nitride, and more particularly, to the deposition of silicon nitride by a microwave plasma CVD process, for example, using a RLSA source.

BACKGROUND OF THE INVENTION

Planar microwave plasma sources are widely used for materials preparation and processing and continue to attract the attention of process engineers in the semiconductor industry. Many practical designs of microwave plasma sources have been disclosed as, for example, in Kawakami et al. U.S. Pat. No. 6,399,520, and C. Tian, T. Nozawa, K. Ishibashi, H. Kameyama, and T. Morimoto, *Characteristics of Large-Diameter Plasma Using a Radial-Line Slot Antenna*, J. Vac. Sci. Technol. A 24(4) 2006, 1421-1424. Under conditions specific for this technology, excited plasmas involve various phenomena and chemical reactions occur in a complex plasma environment, utilizing multi-component reacting gases and flow mixtures, strongly dissociated gases, and various heating conditions. At the surface of the wafers being processed, the chemical and energetic interaction of gas species with the surfaces occurs under ion bombardment, generating synergetic effects in the interaction of the gases with the film surface.

In silicon nitride film deposition from complex molecular precursors, it has not always been understood which species are precursors for film growth. Detailed experimental analysis or accurate modeling of "surface reaction" mechanisms can provide some estimate. Some intermediate products in the bulk or at surfaces being coated may play an important role in the growth mechanism. For example, $NH_3$ can dissociate not only in a bulk plasma but also on a fresh Si-surface, creating hydrogen and $NH_x$ fragments as well. Generally, good stoichiometric silicon nitride has been achieved at higher powers that yield good dissociation and lower silane flow, both with $N_2$ and $NH_3$. Disilane has not been particularly good for causing a Si and N reaction on the wafer surface. Silicon nitride growth has been shown to proceed through the nitridation of Si-rich surfaces, with key factors appearing to be excited molecular nitrogen. Studies have related to RF plasma CVD technology, but less to microwave plasmas, and none to radial line slot antenna (RLSA) plasma sources. Most relate to $SiH_4$ but few relate to $Si_2H_6$. Delivered power is known from PECVD to have an impact on the composition of the silicon nitride films, which means that different precursors may be involved in film growth under various delivered power conditions. With a microwave frequency of 2.45 GHz, electromagnetic fields and power coupled to the processing media has played an important role. This leads to technologically significant differences between microwave plasma systems and lower-frequency RF plasma systems. Microwave plasmas involve phenomena that have not been fully understood. From process point of view, this has led to insufficient control of microwave plasma properties in materials processing.

Lack of knowledge of process conditions and hardware effects have failed to provide silicon nitride films with sufficiently uniform deposition, adequate deposition rates, and good stoichiometry.

SUMMARY OF THE INVENTION

An objective of the present invention is to determine appropriate process and hardware conditions that will provide silicon nitride having good stoichiometry, uniform deposition, and high deposition rate. Another objective of the present invention is to increase the process window for silicon nitride deposition utilizing a RLSA plasma source.

The present invention is in part based upon the discovery that atomic and molecular hydrogen and active hydrogen species are produced when complex gas mixtures, for example those including silane or disilane, ammonia and argon, are energized with a microwave plasma, that then block the nitrogen and silicon atoms and their fragments from bonding to the surface atoms and to grow stoichiometric silicon nitride.

In accordance with principles of the present invention, silicon nitride film thickness uniformity and stoichiometry are controlled and deposition rate is increased by limiting the amounts of atomic or molecular hydrogen from the gas mixture during the deposition process. In accordance with other principles of the invention, chemical vapor deposition (CVD) of silicon nitride from complex gas mixtures is controlled in microwave plasmas by including in the mixture a halogen gas, for example, fluorine. A small ratio of halogen to hydrogen may be sufficient to improve the deposition rate and uniformity of the silicon nitride film.

In certain embodiments of the invention, a halogen gas is added to a gas mixture of silane or disilane, ammonia and argon in a microwave plasma, for example, from a radial line slot antenna (RLSA) plasma source. The halogen is provided to scavenge hydrogen from the gas mixture, and to prevent the hydrogen from blocking the nitrogen and silicon atoms and their fragments from bonding to the surface atoms and to grow stoichiometric silicon nitride. The halogen in an RLSA plasma generates free halogen radicals that react with hydrogen to create hydrogen halide, for example, HF or HCl, thereby scavenging the hydrogen. As a result, the surface coverage of the wafer by hydrogen is reduced, resulting in increased deposition rate of silicon nitride and greater uniformity of the silicon nitride film.

The invention controls film thickness uniformity and stoichiometry in the deposition of silicon nitride from complex gas mixtures in microwave plasmas. More specifically, film thickness uniformity and stoichiometry are controlled when depositing silicon nitride from gas mixtures that include silane or disilane, ammonia or nitrogen, and argon in microwave plasmas.

These and other objects and advantages of the present invention will be more readily apparent from the following detailed description of illustrated embodiments of the invention.

DETAILED DESCRIPTION OF THE ILLUSTRATED EMBODIMENTS OF THE INVENTION

In accordance with certain embodiments of the invention, silicon nitride is deposited by chemical vapor deposition (CVD) by processing the wafer in the presence of a mixture of gases that include silane ($SiH_4$) or disilane ($Si_2H_6$), ammonia ($NH_3$) or nitrogen ($N_2$), and argon (Ar). The gas mixture is energized by thermal heating, or more preferably, by a microwave plasma. The preferred mode of energizing the gases so they react to deposit silicon nitride on a semiconductor wafer is by activating a plasma in the gases using a radial line slot antenna microwave source. One suitable RLSA source is provided in the processing apparatus disclosed in U.S. Pat. No. 6,399,520, hereby expressly incorporated by reference herein. Such an apparatus is illustrated in FIGS. 1 and 2.

Figure 1:
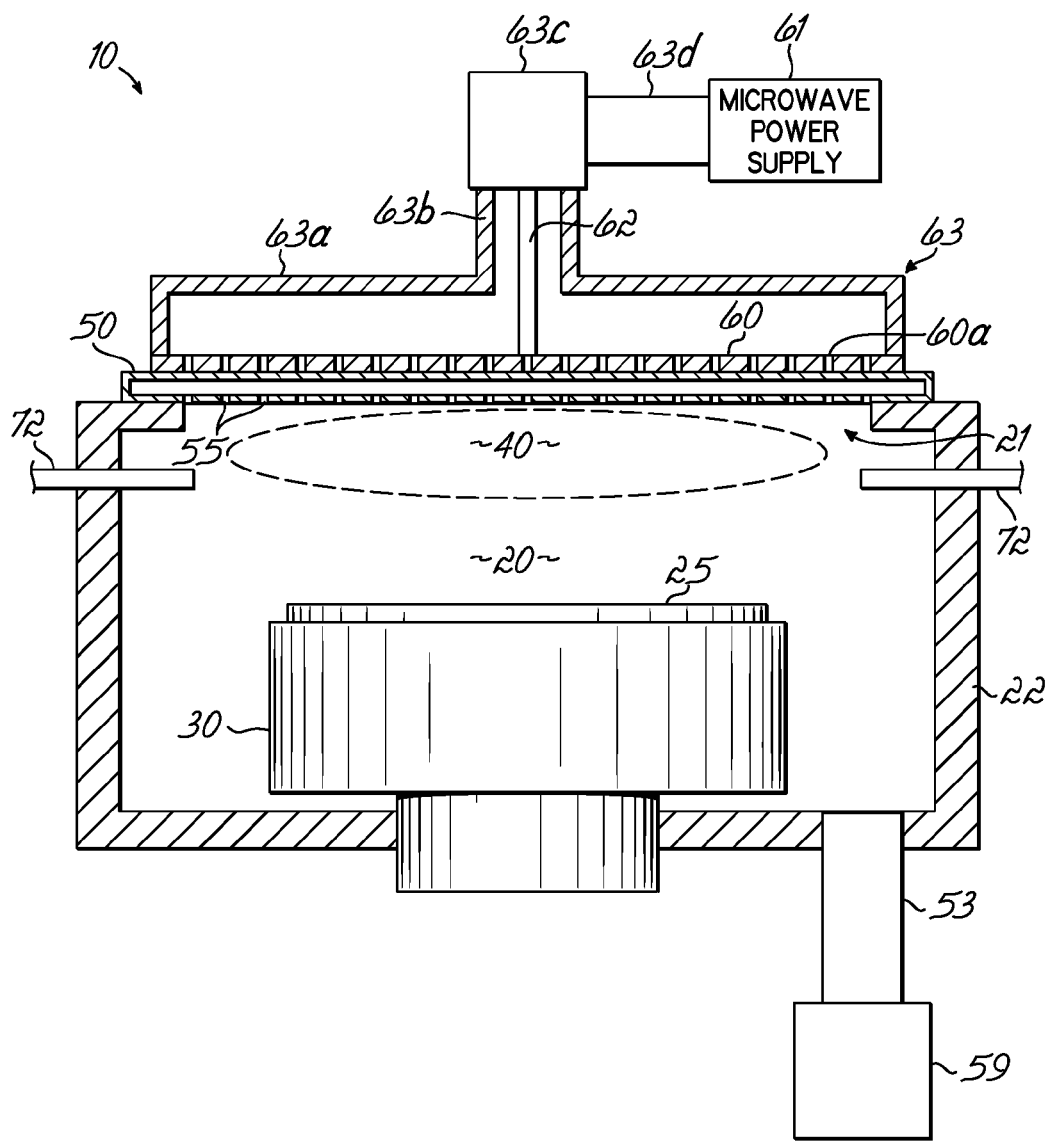
FIG. 1 is a vertical cross-sectional view of a processing apparatus having an RLSA plasma source.
Figure 2:
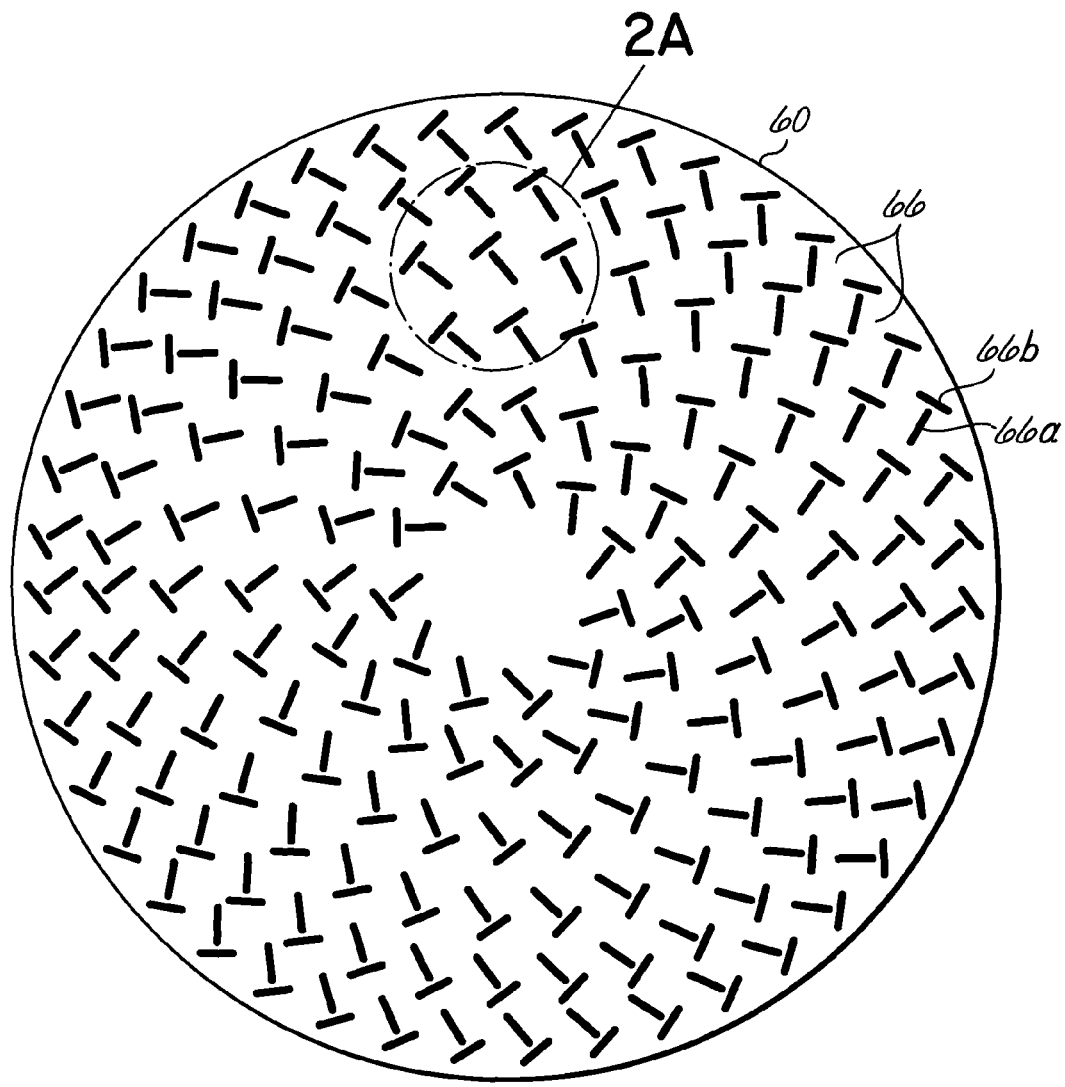
FIG. 2 is a cross-sectional view of the apparatus of FIG. 1 and constituting a plan view of the RLSA.

Referring to FIG. 1, a plasma processing apparatus 10 is illustrated having a vacuum chamber 20 having a chamber wall 22 composed of, for example, aluminum. A semiconductor wafer substrate 25 is supported on the upwardly facing surface of a susceptor 30 within the chamber 20. In the top of the chamber 20 is an opening 21 in the chamber wall 22 that is larger than a semiconductor wafer substrate 25. A flat cylindrical gas supplying chamber of a showerhead 50 is provided in the opening 21 so as to seal the chamber 20. The showerhead 50 is formed of a dielectric material that is compatible with the process gases, such as the silicon nitride being disposed, and that is transparent to microwave energy. As such, the showerhead 50 forms a dielectric window in the otherwise metallic chamber wall 22 of the chamber 20. At the lower surface of the gas supplying chamber of the showerhead 50 are disposed a plurality of gas supplying holes 55 such that gas introduced into the gas supplying chamber of the showerhead 50 is supplied in a shower into the vacuum chamber 50 through the gas supplying holes 55. Into the chamber of showerhead 50, a processing gas, which, for the silicon nitride process to which this invention relates, is injected a silane gas, and preferably disilane gas.

Outside of the gas supplying chamber of the showerhead 50, on the top thereof, is a radial line slot antenna (RLSA) 60, sometimes referred to as a slotted plane antenna (SPA) or more generally as a planar array antenna. The antenna 60 is formed of a conductive material, for example a copper plate. Connected to the antenna 60 on the top thereof is a waveguide 63 that has a high frequency power supply end thereof connected to a microwave power supply 61 that generates microwave energy at, for example, 2.45 GHz. A flat, circular waveguide 63a, a cylindrical waveguide 63b, a coaxial waveguide converter 63c and a square waveguide 63d are combined to form the waveguide 63. The flat, circular waveguide 63a is connected at a lower rim thereof to the RLSA 60. One end of the cylindrical waveguide 63b is connected to an upper surface of the circular waveguide 63a. The coaxial waveguide converter 63c is connected to an upper surface of the cylindrical waveguide 63b. The square waveguide 63d has one end thereof perpendicularly connected to a side surface of the coaxial waveguide converter 63c and the other end thereof connected to the microwave power supply 61.

In the apparatus 10, high frequency RF energy is coupled to the chamber 20 that includes UHF energy and microwaves. The high frequency energy is supplied from the high frequency power supply in the range of from 300 MHz or more to 2500 MHz or less, including UHF of 300 MHz or more and microwaves of 1 GHz or more. Plasma generated by these high frequency powers may be called a high frequency plasma or an RF plasma. Inside of the cylindrical wave guide 63b, an axial conductor 62 is provided that is made of conductive material. The conductor 62 is connected to an approximate center of an upper surface of the RLSA 60. The other end of the axial conductor 62 is coaxially connected to an upper surface of the cylindrical waveguide 63b. Accordingly, the waveguide 63b is a coaxial waveguide.

On a sidewall of an upper side of the vacuum chamber 20, at sixteen positions equally disposed along a circumference direction thereof, is a plurality of gas supplying inlets 72. From the gas supplying inlets 72, gas including a rare gas such as argon (Ar) and a nitrogen containing gas such as molecular nitrogen ($N_2$) or ammonia ($NH_3$) is uniformly supplied around the periphery of a plasma area 40 within the vacuum chamber 20. These gases can be injected separately through dedicated inlets or premixed. Microwave energy that is supplied from the source 61 through the waveguide 63 is radiated through the RLSA 60 into the chamber 20 to energize a plasma in gases introduced through the holes 55 of the showerhead 50 and the inlets 72. The microwave energy from the RLSA 60 passes through the showerhead 50 on the way to the chamber 20 and may also form a plasma that disassociates the silane gas prior to its passing through the holds 55 in the showerhead 50. The silane as well as the neutral and nitrogen containing gases ultimately mix in the plasma area 40. Microwave energy from the RLSA 60 further energizes plasma in the region 40 of the chamber 20.

The susceptor 30 has a built-in temperature regulated heater (not shown). In addition, to the bottom surface of the vacuum chamber 20, an exhaust outlet 53 is provided that is connected to a vacuum pump 59.

Figure 2A:
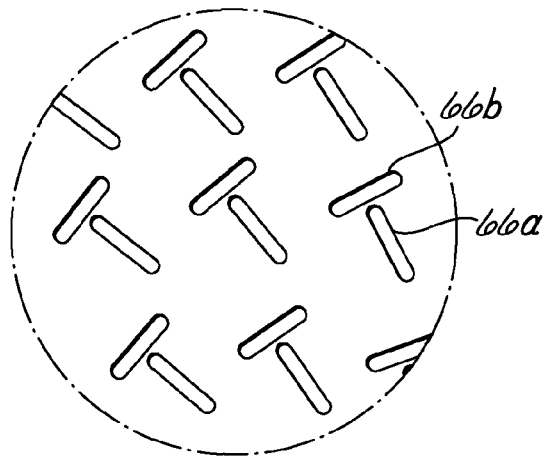
FIG. 2A is an enlarged view of a portion of the RLSA of FIG. 2.

FIG. 2 is a plan view of a RLSA 60 being used in a manufacturing apparatus of semiconductors of the present invention. As shown in FIGS. 2 and 2A, the RLSA 60 has a plurality of slots 66, including a first plurality of slots 66a and a corresponding second plurality of slots 66b. The slots 66 are disposed in pairs including one slot 66a and one slot 66b disposed in concentric rings around the center of the RLSA 60. Each slot 66a and 66b is a groove in the approximate shape of a rectangle. The respective adjacent slots 66a and 66b of each pair are disposed orthogonally relative to each other to form an approximate alphabetical "T" character. The length and spacing of the slots 66a and 66b are determined according to the wavelength of microwaves generated by the microwave power supply 61.

Figure 3A:
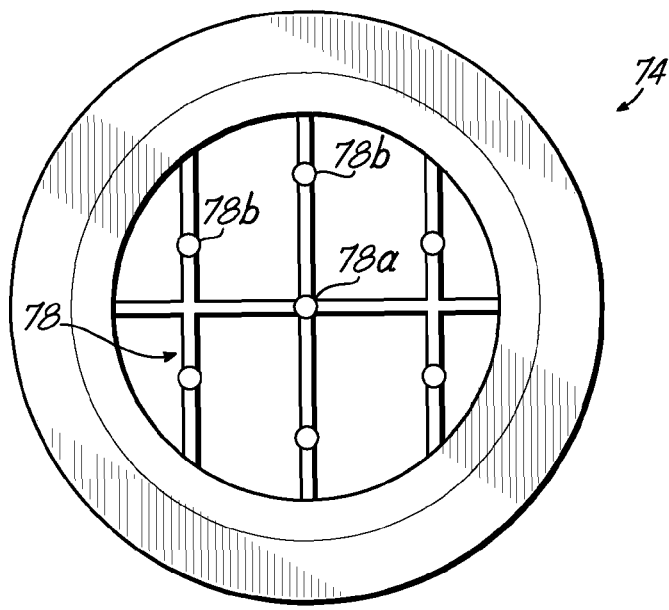
FIG. 3A is a perspective diagram of a gas injection system of the apparatus of FIG. 1.
Figure 3B:
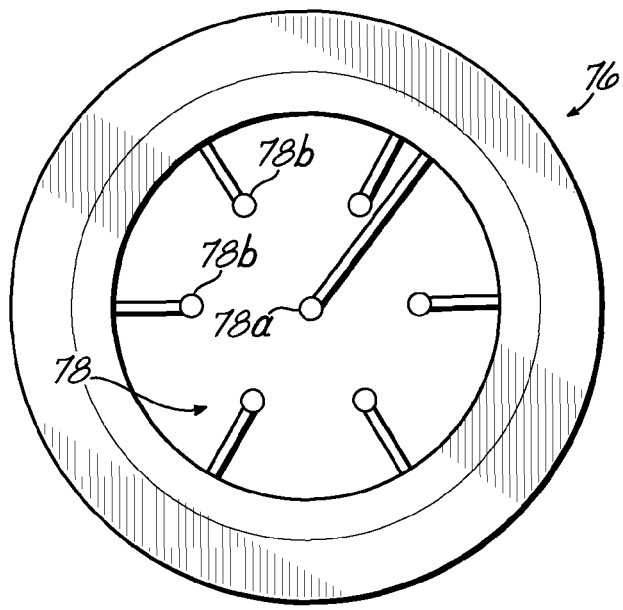
FIG. 3B is a perspective diagram, similar to FIG. 3A, of an alternative gas injection system of the apparatus of FIG. 1.

In the alternative to the inlets 72 in the periphery of the chamber wall 22, as shown, one or more layers of injection nozzles may be used, which may be in the form of the shower injection head 74 shown in FIG. 3A or the spider injection head 76 shown in FIG. 3B. As illustrated, each of the heads 74 and 76 is provided with a distribution of nozzles 78, illustrated by way of example as having a central nozzle 78a and a ring of peripheral nozzles 78b spaced about half of a wafer radius, for example 150 mm, from the center nozzle 78a.

The RLSA activated plasma for the CVD of silicon nitride on the wafer 25 can be formed of disilane from the showerhead 50 mixed with the ammonia or nitrogen mixture from the inlets 72. The three-component gas mixture is then dissociated by the plasma and various reactions within the plasma into many species in the plasma area 40 within the chamber as well as at the surface of the substrate 25. The various species that may be found in the plasma when the gases introduced are Ar, $Si_2H_6$ and $NH_3$ include Ar, Ar*, Ar$^+$, $Si_2H_6$, $Si_2H_4$, $Si_2H_2$, $Si_2H_2^+$, $Si_2H_4^+$, $SiH_4$, $SiH_3$, $SiH_2$, SiH, $SiH_2^+$, $SiH_3^+$, $SiH_3^+$, $NH_3$, $NH_2$, NH, $N_2$, N, $H_2$, H, $NH_3^+$, $NH_2^+$, $N_2^+$, $N^+$ and $H^-$. The inventors have discovered that an excessive amount of the hydrogen, either in an atomic or a molecular state, is produced in such microwave plasmas, even where there is no introduction of hydrogen gas into the chamber. This determination is based on the inventors analysis of RLSA microwave plasma CVD of silicon nitride in a $Si_2H_6$+ $NH_3$+Ar gas mixture. Further, the inventors have discovered that each time the population of hydrogen is increased, the deposition rate of silicon nitride is correspondingly reduced.

Further, the inventors have discovered the dominant species to be electrons, Ar$^+$, $Si_2H_6$, $Si_2H_4$, $Si_2H_2^+$, $Si_2H_4^+$, $SiH_4$, $SiH_3$, $SiH_2$, SiH, $SiH_3^-$, $NH_3$, $NH_2$, NH, $N_2$, $H_2$, $NH_3^+$, $N_2^+$ and $N^+$, and the fluxes toward the surface of the wafer to be Ar$^+$, $Si_2H_6$, $Si_2H_4$, $Si_2H_2^+$, $Si_2H_4^+$, $SiH_4$, $SiH_3$, $SiH_2$, SiH, $NH_3$, $NH_2$, $H_2$, $N_2^+$ and $N^+$, resulting from the RLSA reaction of the $Si_2H_6$+$NH_3$+Ar gas mixture. Accordingly, the gas composition includes neutral species and fluxes at the surface of the wafer 25, for example at about 10 mm above the surface of the wafer 25. The spatial distribution of each component varies inside the chamber 20. The inventors have determined that an excess of hydrogen generates surface coverage of the deposited film during the deposition, thus blocking the nitrogen and silicon atoms and their fragments from bonding to the surface atoms, and thereby adversely affecting the deposition rate and ability to grow stoichiometric silicon nitride.

Figure 4:
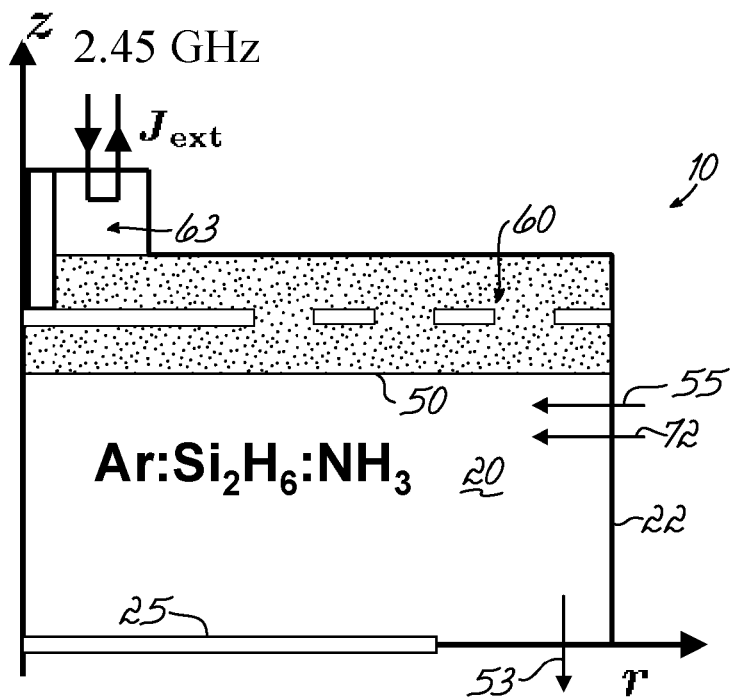
FIG. 4 is a schematic diagram of the chamber of the apparatus of FIG. 1.
Figure 5:
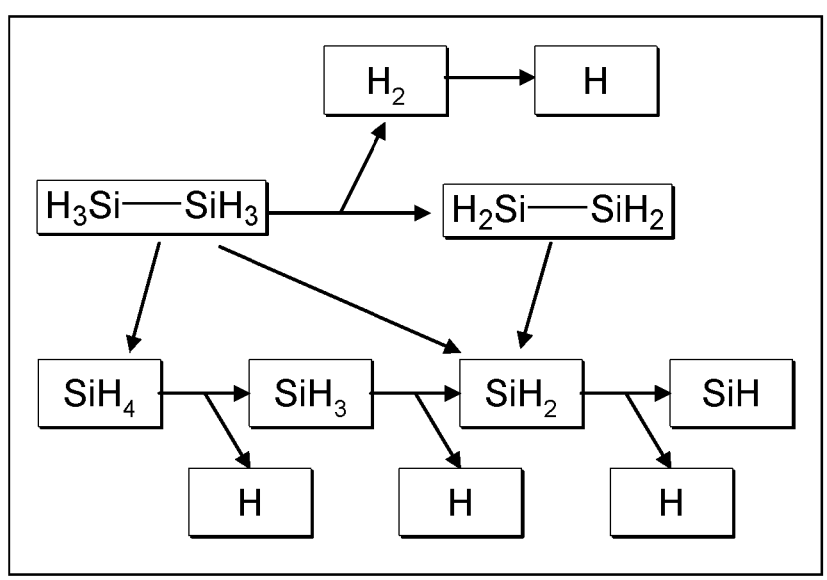
FIG. 5 is a chart depicting the disassociation of disilane and silane in the SiN RLSA plasma CVD process.

FIGS. 4-8 illustrate aspects of the problem identified above. FIG. 4 schematically represents the chamber 20 of the apparatus 10 of FIG. 1, in which the gases Ar, $Si_2H_6$, and $NH_3$ are irradiated with a microwave plasma from the RLSA 60 to produce the reaction for depositing silicon nitride by CVD onto the substrate 25. A schematic representation of the dissociation of disilane is depicted in the chart of FIG. 5, in which a significant amount of hydrogen is produced. The chart shows the dissociation when starting with disilane, but also shows the dissociation of silane. A similar chart can be constructed for the dissociation of ammonia into $NH_2$, NH and H. Gas flow through the chamber can affect the distributions of the active species in the chamber. The gases introduced through the showerhead holes 55 and the inlets 72 enter the chamber where they are exposed to the vacuum and the plasma, where they are dissociated and otherwise activated, undergo reactions, interact with the surface of the wafer, and are exhausted along with reaction products through the pump outlet.

Figure 6:
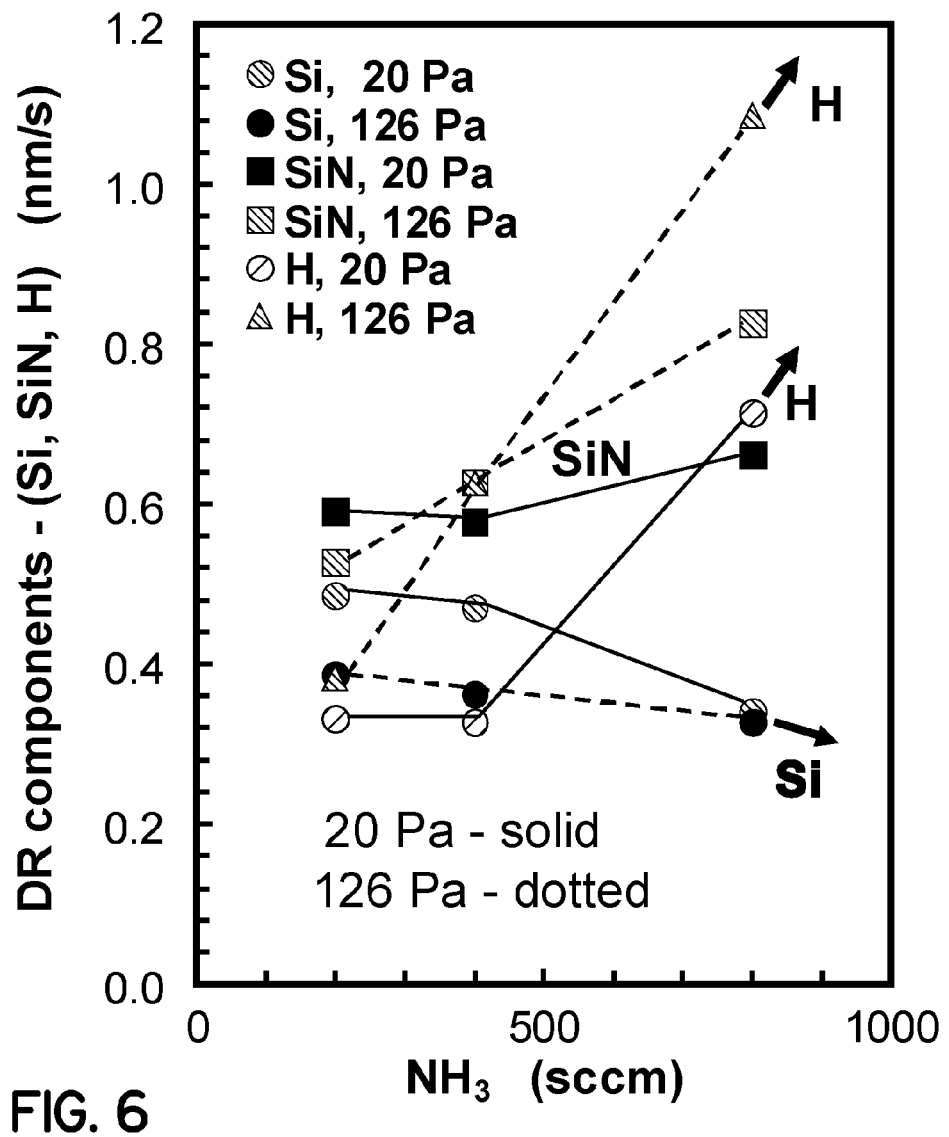
FIG. 6 is a chart showing the increase in the concentration of hydrogen as ammonia gas flow into the chamber is increased.
Figure 6A:
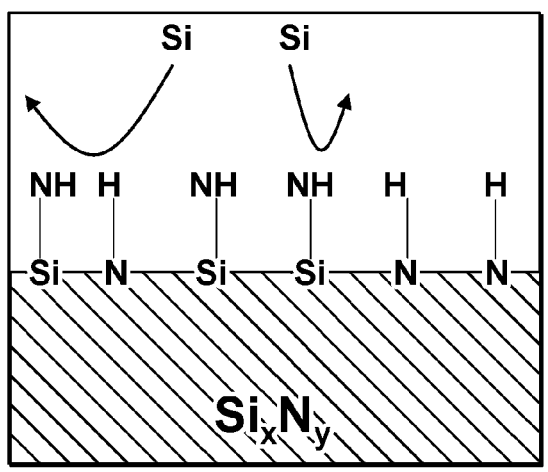
FIG. 6A is a diagram illustrating the mechanism of hydrogen and NH in blocking the reaction of the silicon at the substrate surface.

FIG. 6 is a chart showing the increase in the concentration of hydrogen as ammonia gas flow into the chamber is increased. The corresponding decrease in Si is also depicted. The surface mechanism that is believed to occur is diagrammatically depicted in FIG. 6A, which shows action of hydrogen atoms H and of the hydrogen containing NH in blocking the reaction of the Si at the surface. Typical parameters for these processes might include pressure at 100 mTorr, disilane flow rate at 5 sccm, argon flow rate at 200 sccm, and microwave power delivered by the RLSA of about 2 KW, with the $NH_3$ flow rate ranging from 0 to 1,000 sccm, as stated in FIG. 6.

According to the present invention, the adding of a small halogen fraction into the gas mixture, for example, fluorine or chlorine gas, $F_2$ or $Cl_2$, will generate free halogen radicals that will react with hydrogen and produce a volatile hydrogen-halogen product, for example HF. Another halogen-containing gas that produces a volatile product when combined with hydrogen can alternatively be used. The halogen radicals scavenge the density of the hydrogen, thus reducing its amount to below that which can provide continuous coverage of the wafer surface. This enables the growth of the silicon nitride film. The distribution of the halogen influences hydrogen distribution, and thus deposition rate on the wafer and film uniformity. Introduction of the halogen is provided in a pre-determined optimized location within the RLSA CVD chamber. The halogen gas may be injected through the inlets 72 in FIG. 1, and preferably through dedicated inlets for only the halogen gas. Alternatively, an injection head 74 or 76 of FIG. 3A or 3B may be provided to inject the halogen gas into the chamber 20.

Figure 7:
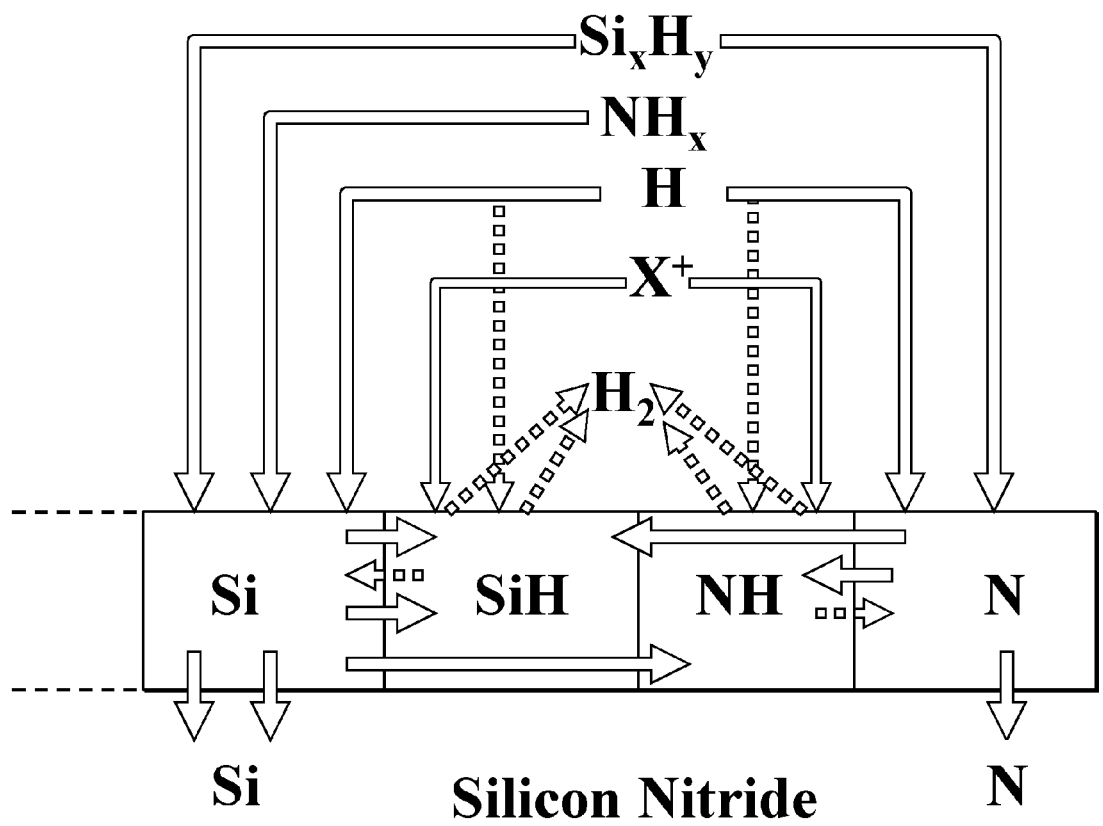
FIG. 7 is a diagram representing the surface mechanism of the SiN deposition process according to an embodiment of the present invention.

The effect of the addition of the halogen gas on the surface mechanism of the deposition process is depicted in the diagram of FIG. 7. The presence of SiH, SiNH and NH species is reduced, or their formation is reduced or prevented by the presence of the halogen atoms and ions X$^+$, which react with the hydrogen at the surface of the wafer 25 to form volatile species, for example, according to the reaction:

More likely and more effective in gas mixtures that include ammonia is the series of reactions:

and

These reactions will prevent or reduce the occurrence of the reaction:

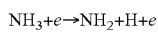

Figure 8:
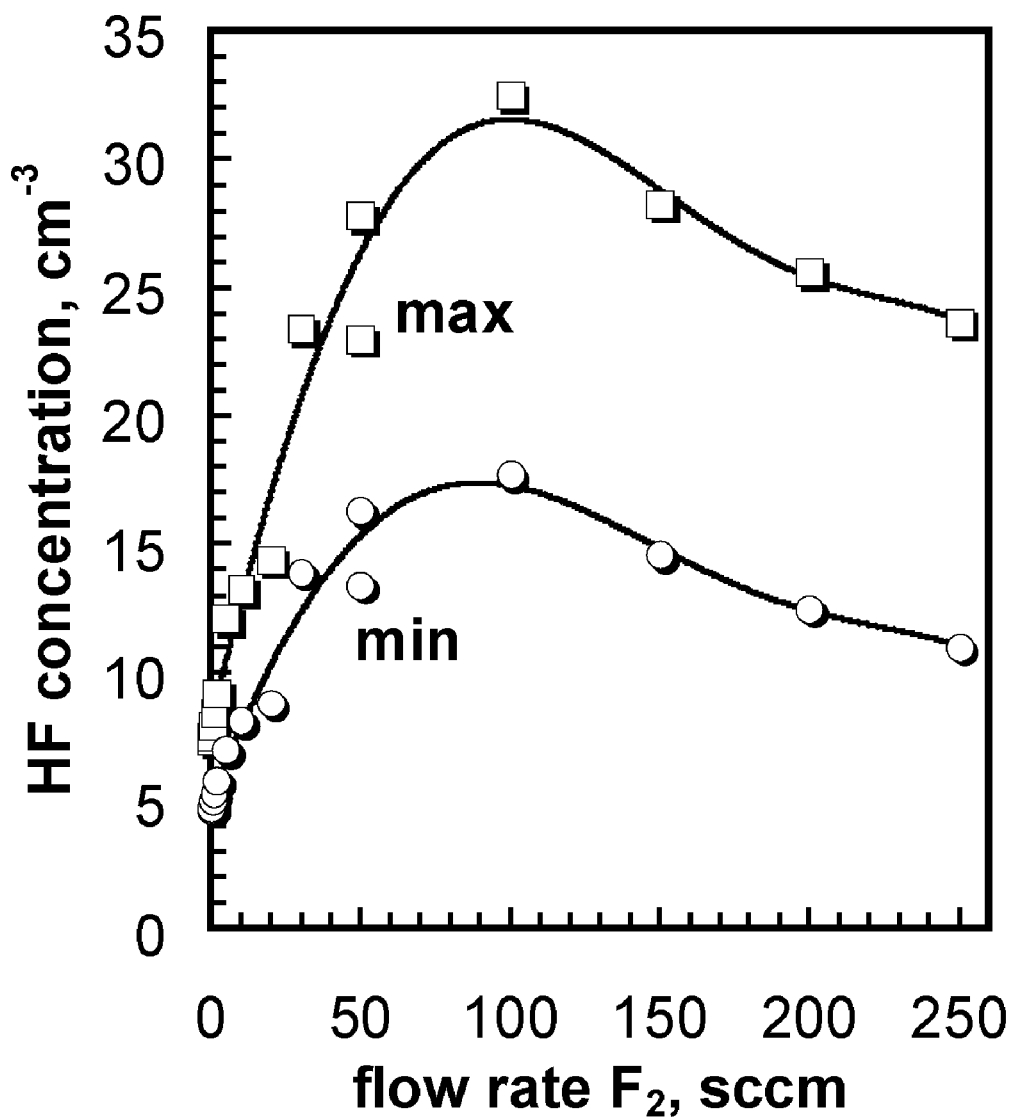
FIG. 8 is a graph showing the increase of HF concentration in the chamber as a function of $F_2$ flow rate.

The graph of FIG. 8 shows the relationship of HF concentration to $F_2$ flow rate. The practical range for the halogen flow rate is from 1 sccm to 50 sccm. This corresponds to pressure at 20 mTorr or 1 Torr, which produce a deposited film with a particular composition, although other pressures can be used depending on the result sought. For those parameters, disilane gas flow was varied from 1 sccm to 16 sccm, although a wider practical range is from 1 to 50 sccm. Ammonia flow rate is typically about 200 sccm, with a wider range being from about 100 sccm to about 500 sccm. Argon flow rate also is typically about 200 sccm, with a wider practical range being from about 100 sccm to about 500 sccm. The total gas flow range is typically in range of from about 200 sccm to about 1000 sccm. Microwave source power of about 2000 Watts is normally effective and may use the allocated frequency of 2.45 GHz. Deposition times depend on the film thickness required, and is typically in the range of from about one to ten minutes. More precisely, the deposition rate is typically in the range of from about tens to hundreds of Angstrom units per minute.

In the processes set forth above in which the presence of hydrogen at a wafer surface has resulted in problems with the deposition of SiN film, controlling or limiting the presence of hydrogen at the surface of a wafer could be carried out with processes other than those involving the introduction of a halogen gas into the chamber. In such cases, any chemicals introduced and any byproducts produced by the process should be compatible with the SiN deposition and not otherwise contaminate the wafer, and should be of a volatile nature that will exhaust from the chamber through the pumping mechanism provided.

Those skilled in the art will appreciate that deletions, additions and modifications can be made to the above described embodiments without departing from the principles of the invention.

Therefore, the following is claimed:

1. A method of forming a silicon nitride film on a semiconductor wafer formed mainly of silicon supported in a processing chamber, the method comprising:
   introducing into the chamber gases that include silane ($SiH_4$) or disilane ($Si_2H_6$) or both, nitrogen ($N_2$) or ammonia ($NH_3$) or both, and a molecular halogen gas ($X_2$) to form a gas mixture thereof in the chamber; and
   irradiating the gases with microwave energy introduced into the chamber through a plurality of slots in a radial line slot antenna to generate a plasma in the gases in the chamber to deposit a silicon nitride film on the wafer.

2. The method of claim 1 wherein:
   the introducing into the chamber of gases includes introducing an inert gas into the chamber to form a gas mixture therein that includes the inert gas.

3. The method of claim 1 wherein:
   the introducing into the chamber of gases includes introducing argon (Ar) into the chamber to form a gas mixture therein that includes argon.

4. The method of claim 1 wherein the irradiating of the gases includes introducing into the chamber about 2,000 watts of microwave energy at a frequency of approximately 2.45 GHz through the radial line slot antenna, irradiating the gases introduced into the chamber therewith, and generating a plasma in the irradiated gases in the chamber.

5. The method of claim 1 wherein the introducing gases into the chamber includes:
   introducing disilane ($Si_2H_6$) gas into a chamber at a flow rate of from 1 to 50 sccm;
   introducing ammonia ($NH_3$) gas into the chamber at a flow rate of from 100 to 500 sccm;
   introducing argon (Ar) gas into the chamber at a flow rate of from 100 to 500 sccm; and
   introducing fluorine ($F_2$) gas into the chamber at a flow rate of from 1 to 50 sccm.

6. The method of claim 5 wherein the irradiating of the gases includes introducing into the chamber about 2,000 watts of microwave energy at a frequency of approximately 2.45 GHz through the radial line slot antenna, irradiating the gases introduced into the chamber therewith, and generating a plasma in the irradiated gases in the chamber.

7. The method of claim 1 wherein:
   the halogen gas includes $F_2$, $Cl_2$, or $F_2$ and $Cl_2$.

8. A method of forming a silicon nitride film on a semiconductor wafer formed mainly of silicon and supported in a processing chamber, the method comprising:
   introducing disilane ($Si_2H_6$) gas into a chamber at a flow rate of from 1 to 50 sccm;
   introducing ammonia ($NH_3$) gas into the chamber at a flow rate of from 100 to 500 Sccm;
   introducing argon (Ar) gas into the chamber at a flow rate of from 100 to 500 sccm;
   introducing fluorine ($F_2$) gas into the chamber at a flow rate of from 1 to 50 sccm;
   introducing into the chamber about 2,000 watts of microwave energy at a frequency of approximately 2.45 GHz through a radial line slot antenna irradiating the gases introduced into the chamber and generating a plasma therewith in the gases in the chamber; and
   depositing a silicon nitride film on the wafer.

9. A method of forming a silicon nitride film on a semiconductor wafer formed mainly of silicon and supported in a processing chamber, the method comprising:
   introducing gases into the chamber to form a gas mixture therein that includes silane or disilane or both, nitrogen or ammonia or both;
   irradiating the gases with microwave energy introduced into the chamber through a plurality of slots in a planar-array antenna to generate a plasma in the gases in the chamber to deposit a silicon nitride film on the wafer; and
   limiting amounts of hydrogen from the gas mixture by introducing a molecular halogen gas into the chamber.

10. The method of claim 9 wherein the limiting of the amounts of hydrogen includes introducing either $F_2$, $Cl_2$, or $F_2$ and $Cl_2$ into the chamber.

11. The method of claim 9 wherein the planar-array antenna is a radial line slot antenna.

12. The method of claim 9 wherein the planar-array antenna is a radial line slot antenna and the irradiating of the gases includes introducing into the chamber about 2,000 watts of microwave energy at a frequency of approximately 2.45 GHz through the radial line slot antenna irradiating the gases and introduced into the chamber and generating a plasma therewith in the gases in the chamber.

13. The method of claim 9 wherein:
   the introducing gases into the chamber includes:
      introducing $Si_2H_6$ gas into a chamber at a flow rate of from 1 to 50 sccm;
      introducing ammonia gas into the chamber at a flow rate of from 100 to 500 sccm;
      introducing argon gas into the chamber at a flow rate of from 100 to 500 sccm; and
      the introducing of molecular halogen gas into the chamber includes introducing fluorine gas ($F_2$) into the chamber at a flow rate of from 1 to 50 sccm.

14. The method of claim 13 wherein the planar-array antenna is a radial line slot antenna and the irradiating of the gases includes introducing into the chamber about 2,000 watts of microwave energy at a frequency of approximately 2.45 GHz through the radial line slot antenna irradiating the gases introduced into the chamber and generating a plasma therewith in the gases in the chamber.

* * * * *